US009116701B2

United States Patent
Priel et al.

(10) Patent No.: US 9,116,701 B2
(45) Date of Patent: Aug. 25, 2015

(54) MEMORY UNIT, INFORMATION PROCESSING DEVICE, AND METHOD

(75) Inventors: Michael Priel, Hertzelia (IL); Joseph Rabinowicz, Even-Yehuda (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 266 days.

(21) Appl. No.: 13/634,755

(22) PCT Filed: Jun. 11, 2010

(86) PCT No.: PCT/IB2010/052598
§ 371 (c)(1),
(2), (4) Date: Sep. 13, 2012

(87) PCT Pub. No.: WO2011/154775
PCT Pub. Date: Dec. 15, 2011

(65) Prior Publication Data
US 2013/0097449 A1 Apr. 18, 2013

(51) Int. Cl.
*G06F 1/32* (2006.01)
*G11C 7/20* (2006.01)
*G11C 5/14* (2006.01)

(52) U.S. Cl.
CPC .............. *G06F 1/3287* (2013.01); *G11C 5/148* (2013.01); *G11C 7/20* (2013.01)

(58) Field of Classification Search
CPC ............................ G06F 1/3225; G06F 1/3287
See application file for complete search history.

(56) References Cited

U.S. PATENT DOCUMENTS

| 6,058,063 | A | 5/2000 | Jang |
| 6,240,048 | B1 | 5/2001 | Matsubara |
| 6,336,161 | B1 | 1/2002 | Watts |
| 7,164,301 | B2 | 1/2007 | Chun |
| 7,610,571 | B2 | 10/2009 | Chen |
| 7,616,041 | B2 | 11/2009 | Frederick, Jr. et al. |
| 7,626,434 | B2 | 12/2009 | Aksamit |
| 7,895,466 | B2 | 2/2011 | Barrow |
| 2004/0230851 | A1 | 11/2004 | Chao et al. |
| 2005/0240848 | A1 | 10/2005 | Cote et al. |
| 2006/0174144 | A1 | 8/2006 | Kim et al. |
| 2006/0255849 | A1* | 11/2006 | Chun ............................ 327/202 |
| 2007/0234077 | A1 | 10/2007 | Rothman et al. |

(Continued)

FOREIGN PATENT DOCUMENTS

WO 2008129362 A2 10/2008

OTHER PUBLICATIONS

Tanenbaum, Andrew; Structured Computer Organization; 1984; Prentice-Hall; Second Edition; pp. 10-12.*

(Continued)

*Primary Examiner* — Mark Connolly
*Assistant Examiner* — Joshua Neveln

(57) ABSTRACT

A memory unit comprises at least two volatile memory elements, analyzing circuitry and power gate. The memory elements may for example be latches, flip-flops, or registers. Each of the memory elements has at least two different states including a predefined reset state. The analyzing circuitry generates a power-down enable signal in response to each of the memory elements being in its reset state. The power gate powers down the memory elements in response to the power-down enable signal. The memory elements may be arranged to assume their reset states upon powering up the memory unit.

14 Claims, 3 Drawing Sheets

(56) References Cited

U.S. PATENT DOCUMENTS

| | | |
|---|---|---|
| 2008/0201592 A1 | 8/2008 | Lawrence et al. |
| 2008/0235528 A1 | 9/2008 | Kim et al. |
| 2008/0259699 A1* | 10/2008 | Van Berkel ............. 365/189.16 |
| 2009/0085552 A1 | 4/2009 | Franza et al. |
| 2010/0174956 A1 | 7/2010 | Kawasaki et al. |
| 2011/0216578 A1 | 9/2011 | Penzes |

OTHER PUBLICATIONS

International Search Report and Written Opinion correlating to PCT/IB2010/052598 dated Feb. 24, 2011.

Non-Final Office Action mailed Dec. 18, 2014 for U.S. Appl. No. 13/634,999, 12 pages.

Notice of Allowance mailed May 20, 2015 for U.S. Appl. No. 13/634,999, 13 pages.

* cited by examiner

MEMORY UNIT, INFORMATION PROCESSING DEVICE, AND METHOD

FIELD OF THE INVENTION

This invention relates to a memory unit, an information processing device, and a method.

BACKGROUND OF THE INVENTION

Semiconductor based logic devices often have a non-negligible power consumption due to leakage currents. Leakage currents occur notably in the interval between two subsequent state transitions. They typically persist even when the device is not performing any logical operations. Quite generally, leakage currents can only be reduced at the cost of operating speed. They are therefore a cause of concern, in particular with modern devices operating at high frequencies.

A well-known solution to saving energy is to set the device, or components thereof, in a so-called sleep state or reduced power mode, when there is a certain likelihood that the device or the components will be idle for a certain period. For example, it is known to switch off a volatile memory when it is expected that the memory will not be required in a near future. The data contained in the volatile memory may be transferred to a low-power memory, e.g. a permanent memory such as a hard disk, before the volatile memory is powered off. Thus the state of the volatile memory is conserved. When a return to normal operation is desired, the data is transferred back from the low-power memory to the volatile memory. A reduced power mode is sometimes referred to alternatively as an idle mode, stand-by mode, suspend mode, sleep mode, deep sleep mode, or hibernate mode.

U.S. Pat. No. 7,164,301 by Ch. Chun proposes a particular technique for saving energy in a memory composed of flip-flops, each flip-flop comprising a latch for holding one bit of information. Each of the latches has a reset state, which is predefined by hardware as either logic TRUE (also termed HIGH or ONE or 1) or logic FALSE (also termed LOW or ZERO or 0). The memory is set into a reduced power mode by switching off those latches which are in their respective reset states. The memory is returned to normal mode by switching on the latches which were switched off and by resetting them into their respective reset states. Thus no information is lost. The method is implemented by providing each individual flip-flop with additional logical circuitry and a power switch (power gate).

SUMMARY OF THE INVENTION

The present invention provides a memory unit, an information processing device, and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
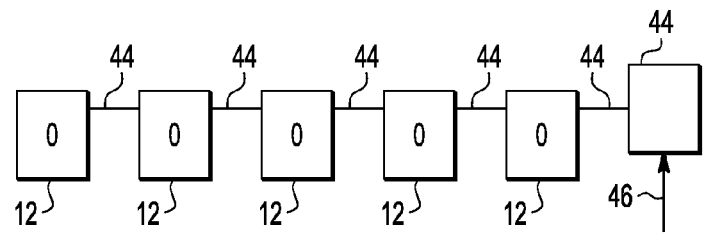
FIG. 1 schematically shows an example of an embodiment of a set of memory elements with reset circuitry.

FIG. 1 illustrates, by way of example, a set of five identical memory elements 12. Each memory element 12 may for example be a latch, a flip-flop or a register. In practice, the set may comprise fewer or more, possibly many more memory elements than five. The memory elements 12 are coupled to reset circuitry 44 for resetting the memory elements 12 collectively into predefined reset states in response to a reset signal 46. In the example, the reset state of each memory element is TRUE, indicated as "0" in the drawing. The figure illustrates the situation in which each of the memory elements is in its reset state.

Figure 2:
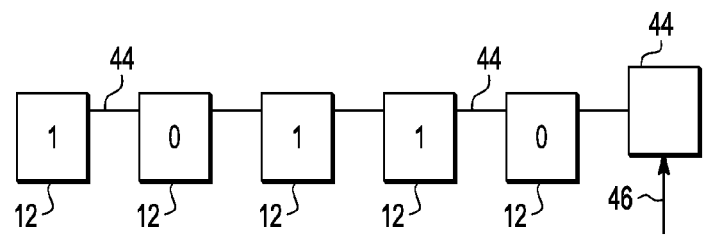
FIG. 2 schematically shows the set of memory elements of FIG. 1.

FIG. 2 illustrates a situation in which the memory elements are, from left to right, in the states "1", "0", "1", "1", and "0", respectively. Accordingly, only the second and fifth memory element are in their reset states whereas the first, third and fourth are not. In an embodiment in which all or some of the memory elements have more than two states, such memory elements may of course assume other states than only "0" and "1".

Figure 3:
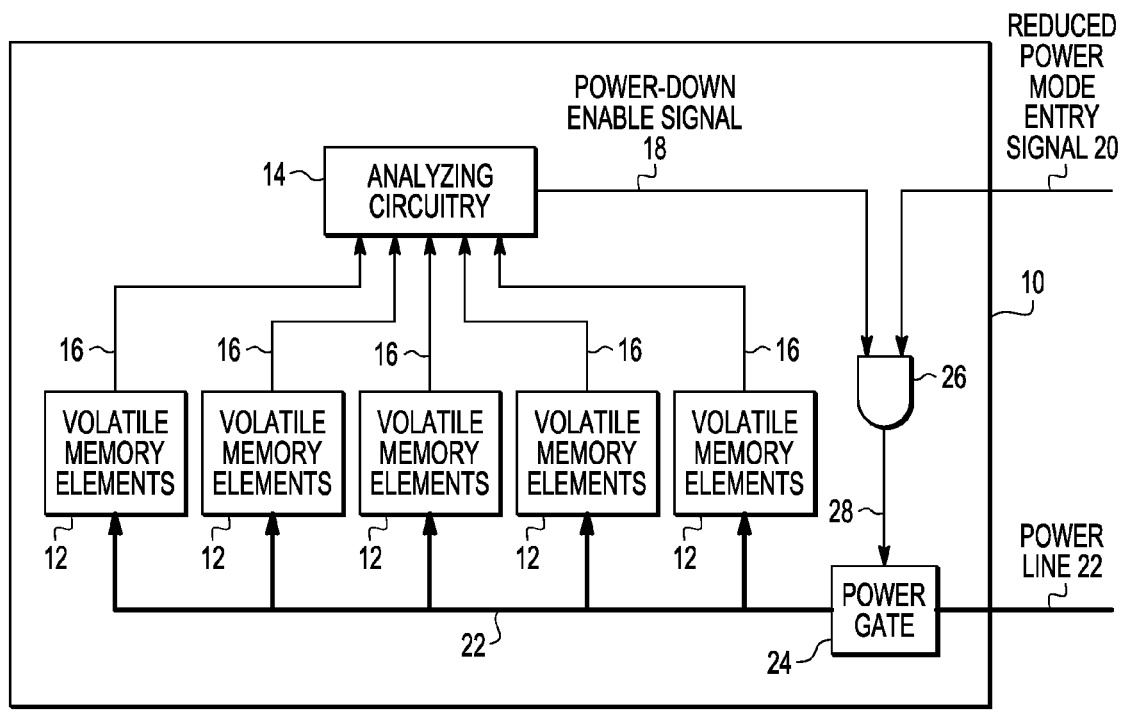
FIG. 3 schematically shows an example of an embodiment of a memory unit.

Shown in FIG. 3 is a memory unit 10 comprising at least two volatile memory elements 12, analyzing circuitry 14, and a power gate 24 for interrupting a power line 22. In the example, memory unit 10 comprises five volatile memory elements 12 as described above by way of example with reference to FIGS. 1 and 2. Each or at least one of said memory elements may be e.g. a latch, a flip-flop, or a register. Each of the memory elements 12 has at least two different states including a predefined reset state. The memory elements may be arranged to assume their reset states upon powering up the memory unit. This can be achieved, for example, by using the reset circuitry 44 as described above with reference to FIGS. 1 and 2.

The analyzing circuitry 14 generates a power-down enable signal 18 in response to each of the memory elements 12 being in its respective reset state. The power gate 24 may power down (deenergize or switch off) the memory elements in response to the power-down enable signal 18 by interrupting the power line 22. It is noted that the power gate 24 and the analyzing circuitry 14 together control not only one, but several memory elements (five in the example). Accordingly, the amount of circuitry is reduced as compared to the power-gating technique described in U.S. Pat. No. 7,164,301.

Figure 5:
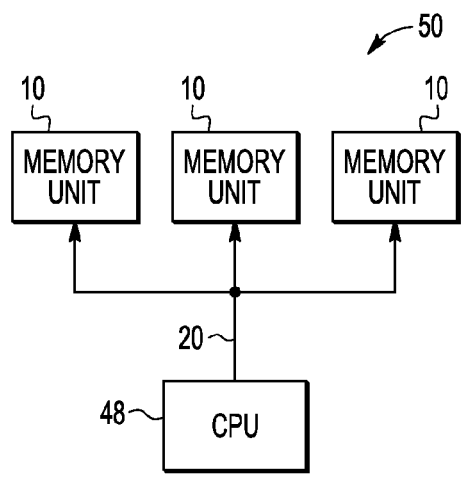
FIG. 5 schematically shows an example of an embodiment of an information processing device.

In the example, a reduced power mode entry signal 20 is received from e.g. a Central Processing Unit (CPU) (see FIG. 5). The reduced power mode entry signal 20 and the power-down enable signal 18 are fed to an AND gate 26. The AND gate 26 outputs a power-down signal 28. The power-down signal 28 is fed to the power gate 24. The power-down signal 28 is TRUE if both the reduced power mode entry signal 20 and the power-down enable signal 18 are TRUE. The power-down signal 28 being TRUE, the power gate 24 powers down the memory elements 12. In other words, the memory elements 12 are powered down in response to both the reduced power mode entry signal 20 and the power-down enable signal 18 being TRUE.

When the signal 20 from e.g. the CPU is FALSE, it constitutes a reduced power mode exit signal. In this case, the power-down signal 28 is FALSE and the power gate 24 energizes the memory elements 12. Similarly the signal 18 from the analyzing circuitry 14 constitutes a power-down disable signal when FALSE. The power-down signal 28 is then FALSE as well and the power gate 24 energizes the memory elements 12.

The power gate 24 thus powers down the memory elements 12 in response to the reduced power mode entry signal 20 and the power-down enable signal 18. The power gate 24 powers up the memory elements 12 in response to the reduced power mode exit signal 20.

Figure 4:
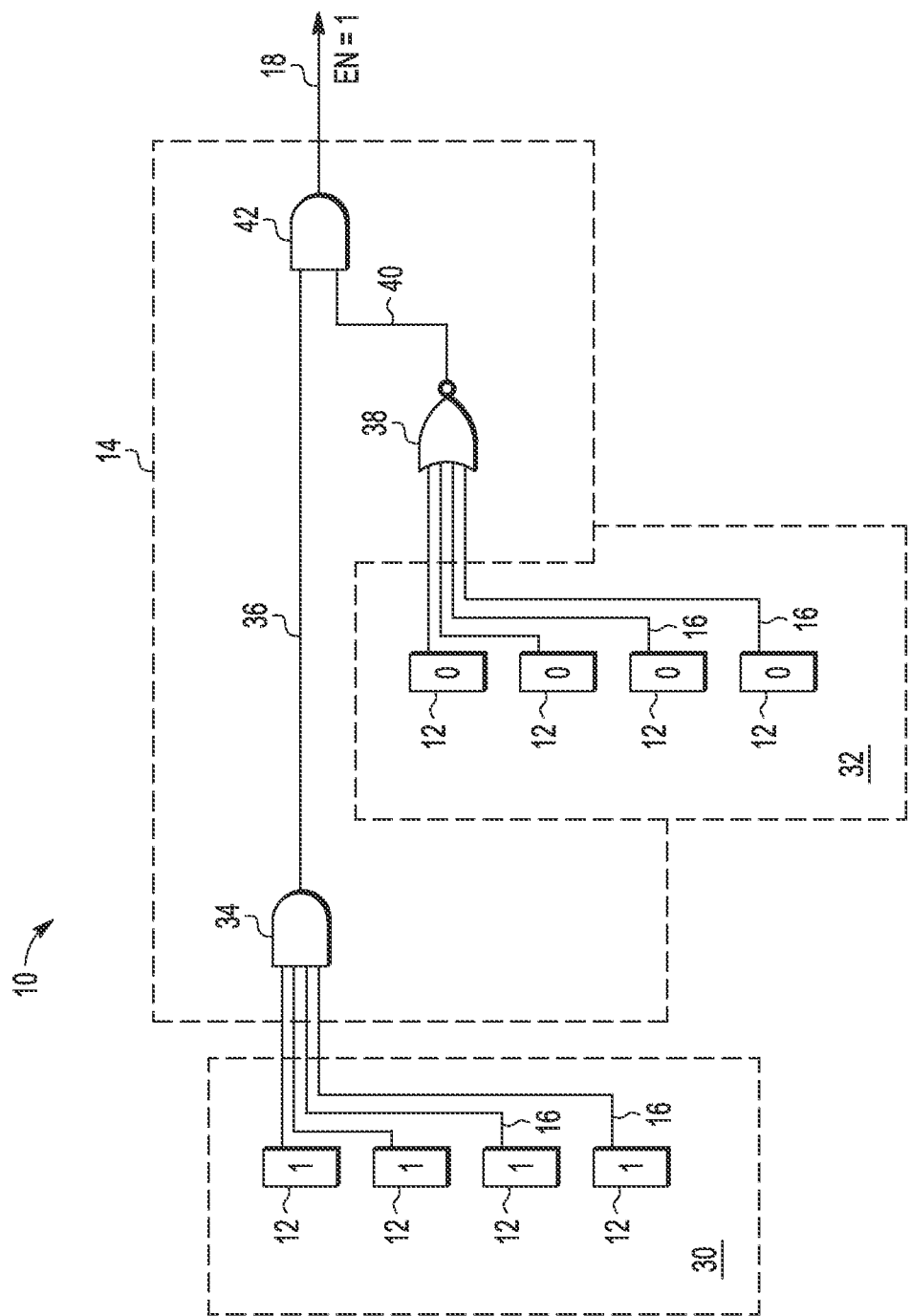
FIG. 4 schematically shows an example of an embodiment of memory elements and analyzing circuitry.

Referring now to FIG. 4, there is illustrated an example of an embodiment of the memory elements 12 and the analyzing circuitry 14 introduced above by way of example with reference to FIG. 1. The exemplary analyzing circuitry 14 comprises at least one logic gate responsive to the current states of at least some of said memory elements 12. In the example shown, the memory unit 10 comprises a set 30 of first memory elements 12, and a set 32 of second memory elements 12. Each of the first memory elements 30 has logic TRUE ("1") as its reset state, while each of the second memory elements 32 has logic FALSE ("0") as its reset state. The analyzing circuitry 14 comprises a first AND gate 34 responsive to the current states of the first memory elements 30, a NOR gate 38 responsive to the current states of the second memory elements 32, and a second AND gate 42 responsive to the output of the first AND gate 34 and the output of the NOR gate 38. The output 36 of the AND gate 34 and the output 40 of the NOR gate 38 are input to the second AND gate 42 to generate the power-down enable signal 18.

Schematically illustrated in FIG. 5 is an information processing device 50 comprising a memory unit 10 as described above by way of example with reference to FIGS. 1 to 4, and a CPU 48. The present exemplary information processing device 50 comprises at least two memory units 10 as described above. The memory units 10 may be identical or different. In any case, each of them comprises memory elements 12, a power gate 24 and analyzing circuitry 14 as described above. The CPU 48 is arranged to provide a reduced power mode entry signal 20 to the memory units 10. The memory units 10 can thus be conveniently powered on and off independently from each other as a function of whether or not their memory elements 12 are in their reset states. The information processing device 10 may have an operating system stored on it. In this case, the reset states may be defined by the operating system, for instance upon start-up or reboot of the operating system.

Figure 6:
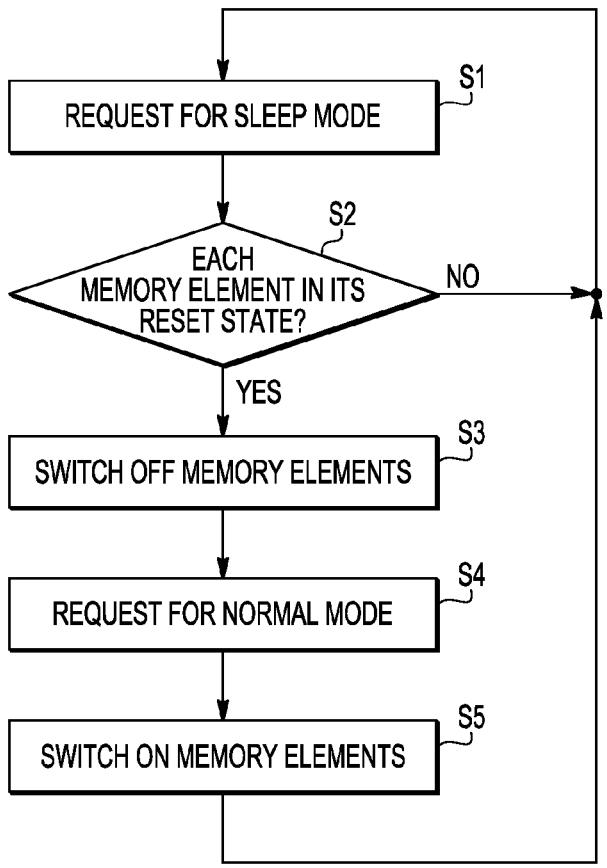
FIG. 6 schematically shows an example of an embodiment of a method of operating a memory unit.

FIG. 6 is a flowchart of a method of operating a memory unit comprising at least two volatile memory elements, each of which memory elements having at least two different states including a predefined reset state. A power-down enable signal is generated in response to each of the memory elements being in its reset state. The memory elements are powered down in response to the power-down enable signal. The method may further comprise powering up the memory unit; and setting each memory element in the memory unit into its reset state.

It should be noted that the memory unit may comprise memory elements in addition to said at least two volatile memory elements. Such additional memory elements do not necessarily have any influence on the power-down enable signal. The memory unit may for example comprise, in addition to said at least two volatile memory elements, one or several memory elements having state retention capabilities. The memory unit may then be switched on and off regardless of the current states of these additional memory elements, by exploiting their state retention capabilities. Such additional memory elements possibly contained in the memory unit are not necessarily described any further in this specification, so as not to detract from the essence of the invention.

In a first step S1, a request for setting the memory unit into sleep mode is received from e.g. a processor. It is then verified whether each of the memory elements of the memory unit is in its reset state (step S2). If all memory elements of the memory unit are found to be in their respective reset states, they are switched off (step S3); otherwise the process returns to step S1. In subsequent step S4, a request for setting the memory unit into a normal operating mode is received from e.g. the processor. In response to this request, the memory elements are switched on (step S5). The process then returns to step S1.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the memory units 10 may be integrated in the CPU 48.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, memory units 10 and CPU 48 may be part of a single integrated circuit. Alternatively, the examples may be implemented as any number of separate integrated circuits or separate devices interconnected with each other in a suitable manner. For example, memory units 10 and CPU 48 may be separate devices connected to each other via a data bus.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A memory unit comprising:
   at least two volatile memory elements comprising at least one of:
      a set of first memory elements, wherein each of said first memory elements has logic TRUE as its reset state; and
      a set of second memory elements, wherein each of said second memory elements has logic FALSE as its reset state;
   analyzing circuitry arranged to generate a power-down enable signal in response to each of said at least two volatile memory elements being in its reset state, wherein
      the analyzing circuitry further comprises:
      a first AND gate responsive to the current states of the first memory elements;
      a NOR gate responsive to the current stated of the second memory element; and
      a second AND gate responsive to the output of the first AND gate and the output of the NOR gate; and
   a power gate arranged to power down the at least two volatile memory elements in response to the power-down enable signal.

2. The memory unit as set forth in claim 1, wherein the at least two volatile memory elements are arranged to assume their reset states upon powering up the memory unit.

3. The memory unit as set forth in claim 1, further comprising
   reset circuitry arranged to set the at least two volatile memory elements into their reset states in response to a reset signal.

4. The memory unit as set forth in claim 1, wherein the power gate is arranged to power down the at least two volatile memory elements in response to a reduced power mode entry signal and the power-down enable signal.

5. The memory unit as set forth in claim 1, wherein the power gate is arranged to power up the memory unit in response to a reduced power mode exit signal.

6. The memory unit as set forth in claim 1, wherein at least one of said at least two volatile memory elements is one of a latch, a flip-flop, or a register.

7. An information processing device, comprising a memory unit as set forth in claim 1.

8. The information processing device as set forth in claim 7, comprising at least two memory units.

9. The information processing device as set forth in claim 7, on which an operating system is stored, the reset states being defined by the operating system.

10. A method of operating a memory unit, the memory unit comprising at least two volatile memory elements, the method comprising:
   generating a power-down enable signal in response to each of said at least two volatile memory elements being in its reset state; and
   powering down said at least two volatile memory elements in response to the power-down enable signal;
   wherein the memory unit comprises at least one of:
      a set of first memory elements, wherein each of said first memory elements has logic TRUE as its reset state; and
      a set of second memory elements, wherein each of said second memory elements has logic FALSE as its reset state; and
   wherein the generating based on:
      a first AND gate responsive to the current state of the first memory elements;
      a NOR gate responsive to the current states of the second memory element; and
      a second AND gate responsive to the output of the first AND gate and the output of the NOR gate.

11. The method as set forth in claim 10, further comprising:
   powering up the memory unit; and
   setting each of said at least two volatile memory elements into its reset state.

12. An information processing device comprising:
   a processor; and
   a plurality of memory units, coupled to the processor, wherein each memory unit comprises:
      a plurality of volatile memory elements comprising at least one of:
         a set of first memory elements, wherein each of said first memory elements has logic TRUE as its reset state; and
         a set of second memory elements, wherein each of said second memory elements has logic FALSE as its reset state;
      analyzing circuitry configured to generate a power-down enable signal in response to each memory element of the plurality of volatile memory elements being in the reset state, wherein the analyzing circuitry further comprises:
         a first AND gate responsive to the current states of the first memory elements;
         a NOR gate responsive to the current states of the second memory element; and
         a second AND gate responsive to the output of the first AND gate and the output of the NOR gate;
      a power gate configured to power down the plurality of volatile memory elements in response to the power-down enable signal.

13. The information processing device of claim 12 wherein the power gate is further configured to power down the plurality of volatile memory elements in response to the power-down enable signal and a reduced power mode entry signal.

14. The information processing device of claim 12 wherein the power gate is further configured to power up the plurality of volatile memory elements in response to a reduced power exit signal.

* * * * *